(12) United States Patent
Jin

(10) Patent No.: US 8,345,731 B2
(45) Date of Patent: *Jan. 1, 2013

(54) METHODS AND APPARATUS FOR REDUCING A SAMPLING RATE DURING A SAMPLING PHASE DETERMINATION PROCESS

(75) Inventor: Xin Jin, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 393 days.

This patent is subject to a terminal disclaimer.

(21) Appl. No.: 12/603,816

(22) Filed: Oct. 22, 2009

(65) Prior Publication Data

US 2010/0040118 A1    Feb. 18, 2010

Related U.S. Application Data

(63) Continuation of application No. 11/177,273, filed on Jul. 8, 2005, now Pat. No. 7,616,707.

(51) Int. Cl.
*H04B 1/00* (2006.01)

(52) U.S. Cl. ........ 375/150; 375/142; 375/147; 375/354; 375/355; 342/108; 342/145; 342/189; 342/378

(58) Field of Classification Search .................. 375/316, 375/342, 343, 360, 362, 364, 366, 373, 142, 375/147, 150, 354–355; 342/108, 145, 189, 342/378

See application file for complete search history.

(56) References Cited

U.S. PATENT DOCUMENTS

| | | | |
|---|---|---|---|
| 3,440,548 A | 4/1969 | Saltzberg | |
| 4,893,316 A | 1/1990 | Janc et al. | |
| 5,533,066 A * | 7/1996 | Yamaguchi et al. | 375/341 |
| 5,590,160 A | 12/1996 | Ostman | |
| 5,841,814 A | 11/1998 | Cupo | |
| 6,130,920 A | 10/2000 | Powell, II et al. | |
| 6,151,353 A * | 11/2000 | Harrison et al. | 375/136 |
| 6,167,258 A | 12/2000 | Schmidt et al. | |
| 6,456,677 B1 | 9/2002 | Hiramatsu et al. | |
| 6,717,996 B1 | 4/2004 | Du Reau et al. | |
| 6,724,847 B1 | 4/2004 | Kallman et al. | |
| 6,728,306 B1 | 4/2004 | Shi | |
| 6,788,735 B2 * | 9/2004 | Kohli et al. | 375/150 |
| 6,985,432 B1 | 1/2006 | Hadad | |

(Continued)

OTHER PUBLICATIONS

European Search Report & Written Opinion for EP Application No. 05254306.3, Dec. 20, 2005.

(Continued)

*Primary Examiner* — Sam K Ahn
*Assistant Examiner* — Sophia Vlahos
(74) *Attorney, Agent, or Firm* — John J. Oskorep, Esq.

(57) ABSTRACT

Control circuitry is configured to control a sampler, in a sampling phase determination process, to sample a signal at a sampling period of $T \pm T/n$ for outputting a sample set for each one of n phases of the sampled signal. Each one of n correlators has a first input configured to receive one of the sample sets, a second input configured to receive a PN signal, and an output which provides a correlation result from a correlation process between the sample set and the PN signal. The control circuitry is further configured to identify, from the correlation results, one of the phases associated with the optimal correlation result. The control circuitry is then configured to control the sampler, in a communication mode, to sample a received signal at a sampling period of T at the phase associated with the optimal correlation result.

20 Claims, 9 Drawing Sheets

U.S. PATENT DOCUMENTS

| | | |
|---|---|---|
| 7,006,840 B2 | 2/2006 | Bultan et al. |
| 7,295,601 B1 | 11/2007 | Sinha et al. |
| 7,443,826 B1 | 10/2008 | Atarius et al. |
| 7,684,373 B2 | 3/2010 | Ekvetchavit et al. |
| 2005/0084037 A1 | 4/2005 | Liang |
| 2005/0101278 A1 | 5/2005 | Peng |

OTHER PUBLICATIONS

Quirk et al., "Analysis of Sampling and Quantization Effects on the Performance of PN Code Tracking Loops", International Conference on Communications, Apr. 28, 2002, pp. 1480-1484, XP01589734, vol. 1 of 5, New York.

* cited by examiner

FIG. 1
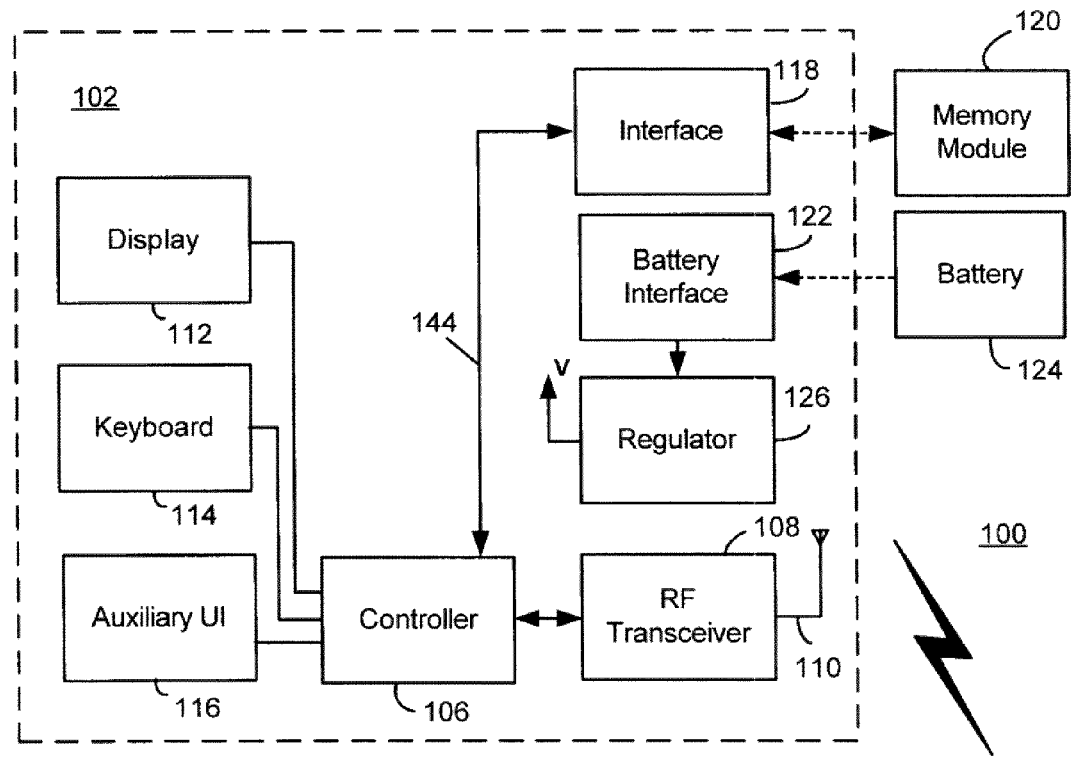
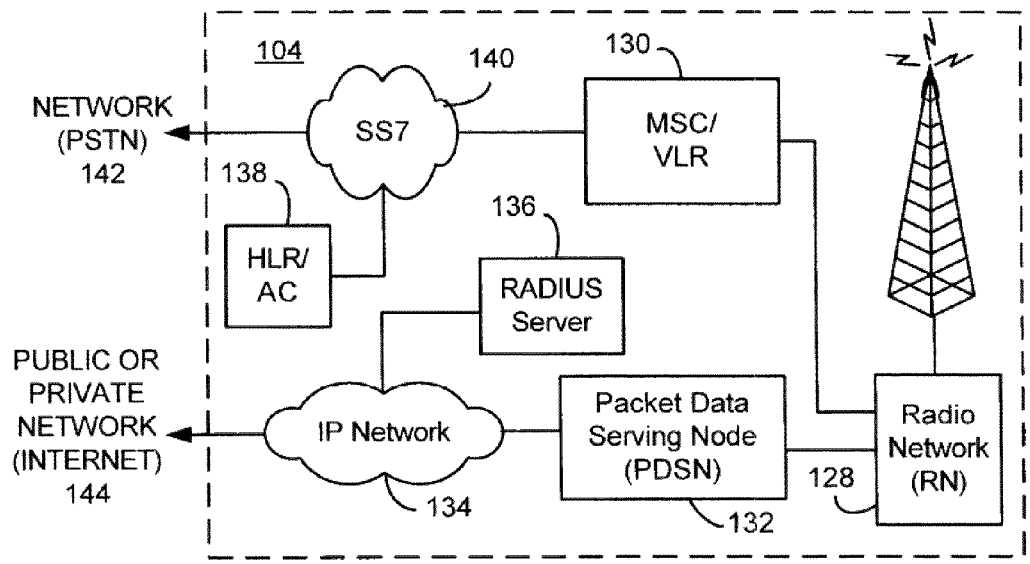

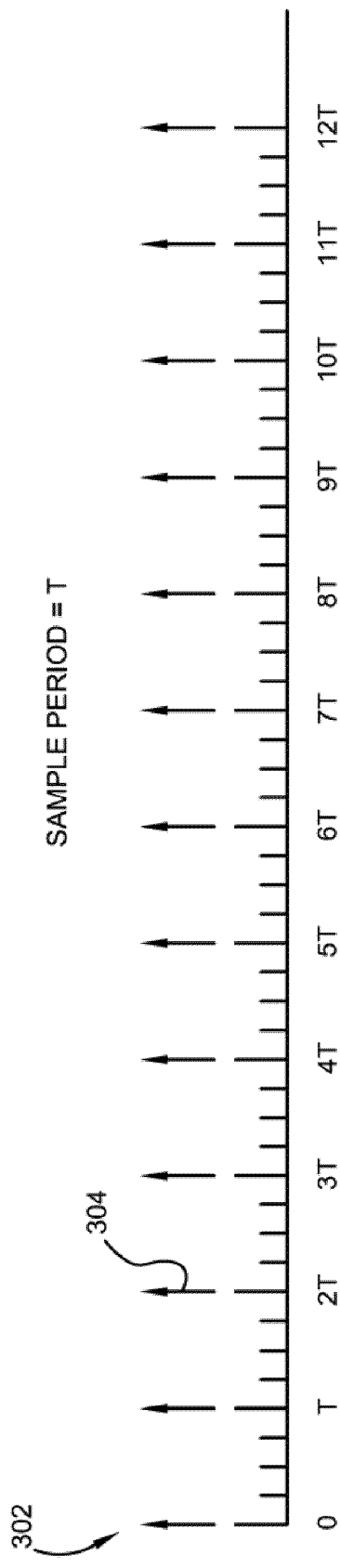
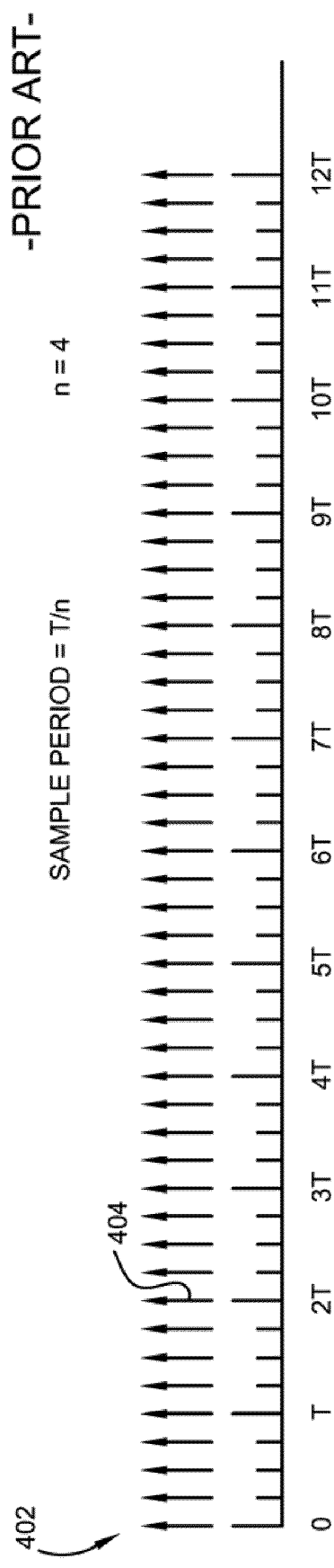
FIG. 3
FIG. 4 —PRIOR ART—

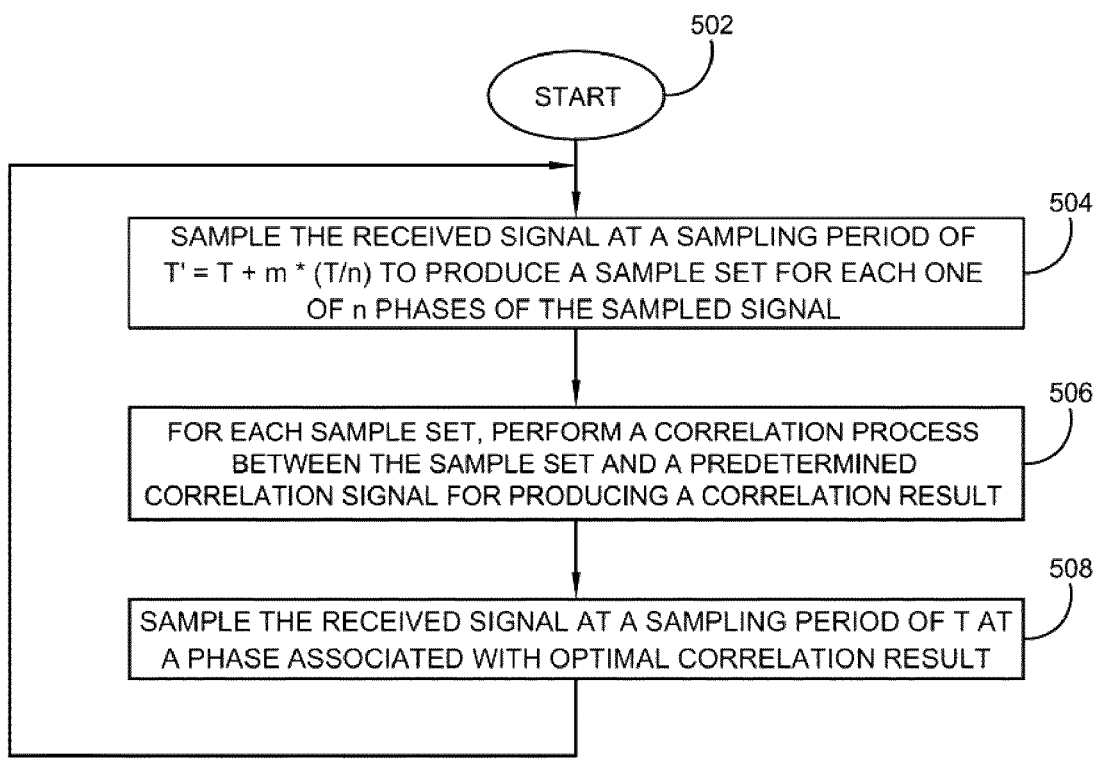

METHODS AND APPARATUS FOR REDUCING A SAMPLING RATE DURING A SAMPLING PHASE DETERMINATION PROCESS

CROSS-REFERENCE TO RELATED APPLICATION

The present application is a continuation of and claims priority to U.S. non-provisional patent application having application Ser. No. 11/177,273 and filing date of 8 Jul. 2005, now U.S. Pat. No. 7,616,707 B2, which is hereby incorporated by reference herein.

BACKGROUND

1. Field of the Technology

The present invention relates generally to digital communications, and more particularly to methods and apparatus for reducing a sampling rate during a sampling phase determination process.

2. Description of the Related Art

A wireless communication device, such as a mobile station operating in a wireless communication network, may provide for both voice telephony and packet data communications. The mobile station may, for example, be compatible with $3^{rd}$ Generation (3G) communication standards (e.g. IS-2000) or utilize Global System for Mobile Communications (GSM), Time Division Multiple Access (TDMA), or Code Division Multiple Access (CDMA) wireless technologies.

All such communications utilize radio frequency (RF) signal detection techniques in a wireless receiver. Here, RF signals are received through an antenna, amplified, and demodulated to recover a digital baseband signal having a symbol or chip period of T. In CDMA or direct sequence spread spectrum (DSSS) communications, each symbol is referred to as a "chip." The baseband signal is sampled by an analog-to-digital converter having a sampler which samples the signal at a sampling period which is determined by a sampling clock signal. Assuming that a phase of the sampling clock signal can be finely adjusted in time so that sampling will occur at the appropriate sampling time instant, user or signaling information may be adequately recovered by sampling the baseband signal at a sampling period of T (i.e. a sampling frequency or rate of 1/T) which may be the same as the symbol or chip period T of the baseband signal.

To find the appropriate phase of the sampling clock signal and thus the optimal sampling time point, a sampling phase determination process is performed. The sampling phase determination process typically involves oversampling (i.e. sampling at a sampling rate greater than 1/T) the baseband signal by n samples per modulation symbol. The value of n may be 4 or 8, for example, so that the baseband signal may be oversampled by as much as 4 or 8 times (e.g. sample period=T/n=T/4 or T/8). Correlation techniques are then utilized to identify an optimal or maximum correlation result associated with the appropriate phase. Subsequently, the baseband signal is down-sampled at the sampling period of T at the appropriate phase identified from the sampling phase determination process to recover the user or signaling information. This process may be repeated during communications to ensure that the sampling clock signal continues to be set at an appropriate phase.

In a typical CDMA or DSSS receiver, a searcher is used to determine a signal delay by correlating samples of the baseband signal with a local pseudorandom noise (PN) code. Once the delay of the PN code and the corresponding baseband signal that produces the strongest correlation is found, PN code synchronization, bit boundary synchronization, the sampling phase determination process are carried out. During the sampling phase determination process, each sample set of phase n of the oversampled baseband signal is correlated with the local PN. Amongst n correlator outputs, the signal associated with the maximum correlation result is associated with the appropriate phase. Usually n is between 4 and 16, depending on the shaping filter and spreading gain. Reference is made to the discussion of FIG. 10 in the detailed description for an electronic circuit used for sampling a received signal according to conventional techniques.

A delay locked loop (DLL) may be utilized in lieu of the CDMA searcher to obtain a fine determination and tracking of the optimal sample phase, where three correlators (i.e. an early correlator, an on-time correlator, and a late correlator) correlates the PN code with three sample phases of I-Q signals. Feedback is utilized to adjust the delay of the samples until the early and late correlators produce the same output level and the on-time correlator produces the highest output level. For TDMA and other non-CDMA communications, a timing estimation loop is typically utilized to adjust the sampling time in accordance with a criterion that maximizes the "eye-diagram opening." Such schemes also utilize oversampling techniques. In lieu of any of the above-described techniques, a sampling rate greater than twice the signal bandwidth may be utilized according to the Shannon sampling theorem or Nyquist principle, so that optimal sampling points between available samples may be interpolated.

In high bandwidth communication systems (e.g. wireless local area network (WLAN) such as 802.11b), high sampling rates require more expensive hardware (e.g. analog-to-digital converter, digital processing unit, and/or buffer memory) and higher power consumption. For a low-cost, handheld mobile device utilizing one or more batteries or a battery pack, these properties are undesirable. Accordingly, what are needed are methods and apparatus for reducing a sampling rate during a sampling phase determination process so as to overcome the deficiencies in the prior art.

BRIEF DESCRIPTION OF THE DRAWINGS

Embodiments of present invention will now be described by way of example with reference to attached figures, wherein:

FIG. 1 is a block diagram which illustrates pertinent components of a mobile station and a wireless communication network;

FIG. 3 is a timing diagram which illustrates a plurality of sample points produced at a desired sampling period of T which may be equal to a symbol period or chip period of a received signal;

FIG. 4 is another timing diagram which illustrates a plurality of sample points produced at an oversampling period of T/n during a sampling phase determination process of the prior art;

FIG. 5 is a flowchart which describes a method for use in reducing a sampling rate during a sampling phase determination process of the present application;

DETAILED DESCRIPTION OF THE PREFERRED EMBODIMENTS

Figure 2:
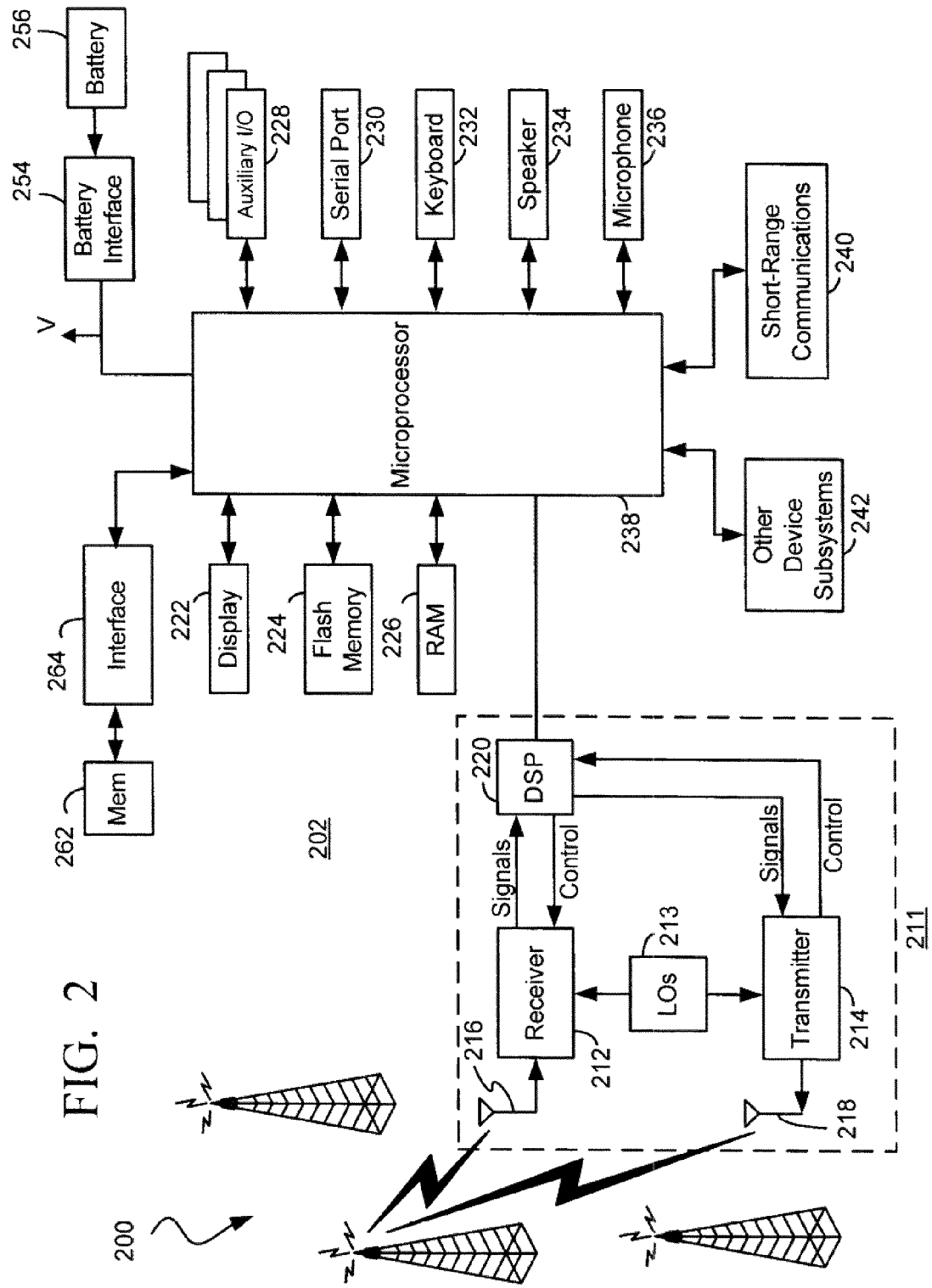
FIG. 2 is a more detailed diagram of a preferred mobile station of FIG. 1.

In one illustrative example of techniques of the present application, a received signal is sampled at a sampling period of T+m*(T/n) during a sampling phase determination process. T may be a symbol or chip period of the received signal, n is a number of phases of the sampled signal, T/n is a phase resolution period, and m is a fixed non-zero integer value where −n<m<n (e.g. m=1 or −1). By sampling the received signal at the sampling period of T+m*(T/n), a sample set for each one of n phases of the sampled signal is produced. For each sample set, a correlation process is performed between the sample set and a predetermined correlation signal to produce a correlation result. Once an optimal correlation result is identified from the correlation process, the received signal is sampled at a sampling period of T at a phase associated with the optimal correlation result. Advantageously, oversampling at a sampling period of T/n (where n≥2) is not required during the sampling phase determination process, which may reduce cost and power consumption.

FIG. 1 is a block diagram of a communication system 100, which includes a mobile station 102, which communicates through a wireless communication network 104. Mobile station 102 preferably includes a visual display 112, a keyboard 114, and perhaps one or more auxiliary user interfaces (UI) 116, each of which is coupled to a controller 106. Controller 106 is also coupled to radio frequency (RF) transceiver circuitry 108 and an antenna 110. Typically, controller 106 is embodied as a central processing unit (CPU), which runs operating system software in a memory component (not shown). Controller 106 will normally control overall operation of mobile station 102, whereas signal-processing operations associated with communication functions are typically performed in RF transceiver circuitry 108. Controller 106 interfaces with device display 112 to display received information, stored information, user inputs, and the like. Keyboard 114, which may be a telephone type keypad or full alphanumeric keyboard, is normally provided for entering data for storage in mobile station 102, information for transmission to network 104, a telephone number to place a telephone call, commands to be executed on mobile station 102, and possibly other or different user inputs.

Mobile station 102 sends communication signals to and receives communication signals from network 104 over a wireless link via antenna 110. RF transceiver circuitry 108 performs functions similar to those of a radio network (RN) 128, including for example modulation/demodulation and possibly encoding/decoding and encryption/decryption. It is also contemplated that RF transceiver circuitry 108 may perform certain functions in addition to those performed by RN 128. It will be apparent to those skilled in art that RF transceiver circuitry 108 will be adapted to particular wireless network or networks in which mobile station 102 is intended to operate.

Mobile station 102 includes a battery interface 122 for receiving one or more rechargeable batteries 124. Battery 124 provides electrical power to electrical circuitry in mobile station 102, and battery interface 122 provides for a mechanical and electrical connection for battery 124. Battery interface 122 is coupled to a regulator 126 which regulates power to the device, providing an output having a regulated voltage V. Mobile station 102 also operates using a memory module 120, such as a Subscriber Identity Module (SIM) or a Removable User Identity Module (R-UIM), which is connected to or inserted in mobile station 102 at an interface 118.

Mobile station 102 may consist of a single unit, such as a data communication device, a cellular telephone, a multiple-function communication device with data and voice communication capabilities, a personal digital assistant (PDA) enabled for wireless communication, or a computer incorporating an internal modem. Alternatively, mobile station 102 may be a multiple-module unit comprising a plurality of separate components, including but in no way limited to a computer or other device connected to a wireless modem. In particular, for example, in the mobile station block diagram of FIG. 1, RF transceiver circuitry 108 and antenna 110 may be implemented as a radio modem unit that may be inserted into a port on a laptop computer. In this case, the laptop computer would include display 112, keyboard 114, one or more auxiliary UIs 116, and controller 106 embodied as the computer's CPU. It is also contemplated that a computer or other equipment not normally capable of wireless communication may be adapted to connect to and effectively assume control of RF transceiver circuitry 108 and antenna 110 of a single-unit device such as one of those described above. Such a mobile station 102 may have a more particular implementation as described later in relation to mobile station 202 of FIG. 2.

Mobile station 102 communicates in and through wireless communication network 104. In the embodiment of FIG. 1, wireless network 104 is a Third Generation (3G) supported network based on Code Division Multiple Access (CDMA) technologies. In particular, wireless network 104 is a cdma2000™ network which includes fixed network components coupled as shown in FIG. 1. Cdma2000™ is a trademark of the Telecommunications Industry Association (TIA). Wireless network 104 of the cdma2000-type includes a Radio Network (RN) 128, a Mobile Switching Center (MSC) 130, a Signaling System 7 (SS7) network 140, a Home Location Register/Authentication Center (HLR/AC) 138, a Packet Data Serving Node (PDSN) 132, an IP network 134, and a Remote Authentication Dial-In User Service (RADIUS) server 136. SS7 network 140 is communicatively coupled to a network 142 (such as a Public Switched Telephone Network or PSTN), whereas IP network is communicatively coupled to a network 144 (such as the Internet).

During operation, mobile station 102 communicates with RN 128, which performs functions such as call-setup, call processing, and mobility management. RN 128 includes a plurality of base station transceiver systems that provide wireless network coverage for a particular coverage area commonly referred to as a "cell". A given base station transceiver system of RN 128, such as the one shown in FIG. 1, transmits communication signals to and receives communication signals from mobile stations within its cell. The base station transceiver system normally performs such functions as modulation and possibly encoding and/or encryption of signals to be transmitted to the mobile station in accordance with particular, usually predetermined, communication protocols and parameters, under control of its controller. The base station transceiver system similarly demodulates and possibly decodes and decrypts, if necessary, any communication signals received from mobile station 102 within its cell. Communication protocols and parameters may vary between different networks. For example, one network may employ a different modulation scheme and operate at different frequencies than other networks. The underlying services may also differ based on its particular protocol revision.

The wireless link shown in communication system 100 of FIG. 1 represents one or more different channels, typically different radio frequency (RF) channels, and associated protocols used between wireless network 104 and mobile station 102. An RF channel is a limited resource that must be conserved, typically due to limits in overall bandwidth and a limited battery power of mobile station 102. Those skilled in art will appreciate that a wireless network in actual practice may include hundreds of cells depending upon desired overall expanse of network coverage. All pertinent components may be connected by multiple switches and routers (not shown), controlled by multiple network controllers.

For all mobile station's 102 registered with a network operator, permanent data (such as mobile station 102 user's profile) as well as temporary data (such as mobile station's 102 current location) are stored in a HLR/AC 138. In case of a voice call to mobile station 102, HLR/AC 138 is queried to determine the current location of mobile station 102. A Visitor Location Register (VLR) of MSC 130 is responsible for a group of location areas and stores the data of those mobile stations that are currently in its area of responsibility. This includes parts of the permanent mobile station data that have been transmitted from HLR/AC 138 to the VLR for faster access. However, the VLR of MSC 130 may also assign and store local data, such as temporary identifications. HLR/AC 138 also authenticates mobile station 102 on system access.

In order to provide packet data services to mobile station 102 in a cdma2000-based network, RN 128 communicates with PDSN 132. PDSN 132 provides access to the Internet 144 (or intranets, Wireless Application Protocol (WAP) servers, etc.) through IP network 134. PDSN 132 also provides foreign agent (FA) functionality in mobile IP networks as well as packet transport for virtual private networking. PDSN 132 has a range of IP addresses and performs IP address management, session maintenance, and optional caching. RADIUS server 136 is responsible for performing functions related to authentication, authorization, and accounting (AAA) of packet data services, and may be referred to as an AAA server.

Although the system described above relates to cdma2000-based network and technologies, other suitable networks and technologies may be utilized such as an 802.11-based wireless local area network (WLAN).

FIG. 2 is a detailed block diagram of a preferred mobile station 202 utilized in the present application. Mobile station 202 is preferably a two-way communication device having at least voice and advanced data communication capabilities, including the capability to communicate with other computer systems. Depending on the functionality provided by mobile station 202, it may be referred to as a data messaging device, a two-way pager, a cellular telephone with data messaging capabilities, a wireless Internet appliance, or a data communication device (with or without telephony capabilities). Mobile station 202 may communicate with any one of a plurality of base station transceiver systems 200 within its geographic coverage area.

Mobile station 202 will normally incorporate a communication subsystem 211, which includes a receiver 212, a transmitter 214, and associated components, such as one or more (preferably embedded or internal) antenna elements 216 and 218, local oscillators (LOs) 213, and a processing module such as a digital signal processor (DSP) 220. Communication subsystem 211 is analogous to RF transceiver circuitry 108 and antenna 110 shown in FIG. 1. As will be apparent to those skilled in field of communications, particular design of communication subsystem 211 depends on the communication network in which mobile station 202 is intended to operate.

Mobile station 202 may send and receive communication signals over the network after required network registration or activation procedures have been completed. Signals received by antenna 216 through the network are input to receiver 212, which may perform such common receiver functions as signal amplification, frequency down conversion, filtering, channel selection, and like, and in example shown in FIG. 2, analog-to-digital (A/D) conversion. A/D conversion of a received signal allows more complex communication functions such as demodulation and decoding to be performed in DSP 220. In a similar manner, signals to be transmitted are processed, including modulation and encoding, for example, by DSP 220. These DSP-processed signals are input to transmitter 214 for digital-to-analog (D/A) conversion, frequency up conversion, filtering, amplification and transmission over communication network via antenna 218. DSP 220 not only processes communication signals, but also provides for receiver and transmitter control. For example, the gains applied to communication signals in receiver 212 and transmitter 214 may be adaptively controlled through automatic gain control algorithms implemented in DSP 220.

Network access is associated with a subscriber or user of mobile station 202, and therefore mobile station 202 may require a memory module 262, such as a Subscriber Identity Module or "SIM" card or a Removable User Identity Module (R-UIM), to be inserted in or connected to an interface 264 of mobile station 202 in order to operate in the network. Since mobile station 202 is a mobile battery-powered device, it also includes a battery interface 254 for receiving one or more rechargeable batteries 256. Such a battery 256 provides electrical power to most if not all electrical circuitry in mobile station 202, and battery interface 254 provides for a mechanical and electrical connection for it. Battery interface 254 is coupled to a regulator (not shown) which regulates power to all of the circuitry, providing an output having a regulated voltage V.

Microprocessor 238, which is one implementation of controller 106 of FIG. 1, controls overall operation of mobile station 202. Communication functions, including at least data and voice communications, are performed through communication subsystem 211. Microprocessor 238 also interacts with additional device subsystems such as a display 222, a flash memory 224, a random access memory (RAM) 226, auxiliary input/output (I/O) subsystems 228, a serial port 230, a keyboard 232, a speaker 234, a microphone 236, a short-range communications subsystem 240, and any other device subsystems generally designated at 242. Some of the subsystems shown in FIG. 2 perform communication-related functions, whereas other subsystems may provide "resident" or on-device functions. Notably, some subsystems, such as keyboard 232 and display 222, for example, may be used for both communication-related functions, such as entering a text message for transmission over a communication network, and device-resident functions such as a calculator or task list. Operating system software used by microprocessor 238 is preferably stored in a persistent store such as flash memory 224, which may alternatively be a read-only memory (ROM) or similar storage element (not shown). Those skilled in the art will appreciate that the operating system, specific device applications, or parts thereof, may be temporarily loaded into a volatile store such as RAM 226.

Microprocessor 238, in addition to its operating system functions, preferably enables execution of software applications on mobile station 202. A predetermined set of applications, which control basic device operations, including at least data and voice communication applications, will normally be installed on mobile station 202 during its manufacture. A preferred application that may be loaded onto mobile station 202 may be a personal information manager (PIM) application having the ability to organize and manage data items relating to user such as, but not limited to, e-mail, calendar events, voice mails, appointments, and task items. Naturally, one or more memory stores are available on mobile station 202 and SIM 256 to facilitate storage of PIM data items and other information.

The PIM application preferably has the ability to send and receive data items via the wireless network. In a preferred embodiment, PIM data items are seamlessly integrated, synchronized, and updated via the wireless network, with the mobile station user's corresponding data items stored and/or associated with a host computer system thereby creating a mirrored host computer on mobile station 202 with respect to such items. This is especially advantageous where the host computer system is the mobile station user's office computer system. Additional applications may also be loaded onto mobile station 202 through network, an auxiliary I/O subsystem 228, serial port 230, short-range communications subsystem 240, or any other suitable subsystem 242, and installed by a user in RAM 226 or preferably a non-volatile store (not shown) for execution by microprocessor 238. Such flexibility in application installation increases the functionality of mobile station 202 and may provide enhanced on-device functions, communication-related functions, or both. For example, secure communication applications may enable electronic commerce functions and other such financial transactions to be performed using mobile station 202.

In a data communication mode, a received signal such as a text message, an e-mail message, or web page download will be processed by communication subsystem 211 and input to microprocessor 238. Microprocessor 238 will preferably further process the signal for output to display 222 or alternatively to auxiliary I/O device 228. A user of mobile station 202 may also compose data items, such as e-mail messages, for example, using keyboard 232 in conjunction with display 222 and possibly auxiliary I/O device 228. Keyboard 232 is preferably a complete alphanumeric keyboard and/or telephone-type keypad. These composed items may be transmitted over a communication network through communication subsystem 211.

For voice communications, the overall operation of mobile station 202 is substantially similar, except that the received signals would be output to speaker 234 and signals for transmission would be generated by microphone 236. Alternative voice or audio I/O subsystems, such as a voice message recording subsystem, may also be implemented on mobile station 202. Although voice or audio signal output is preferably accomplished primarily through speaker 234, display 222 may also be used to provide an indication of the identity of a calling party, duration of a voice call, or other voice call related information, as some examples.

Serial port 230 in FIG. 2 is normally implemented in a personal digital assistant (PDA)-type communication device for which synchronization with a user's desktop computer is a desirable, albeit optional, component. Serial port 230 enables a user to set preferences through an external device or software application and extends the capabilities of mobile station 202 by providing for information or software downloads to mobile station 202 other than through a wireless communication network. The alternate download path may, for example, be used to load an encryption key onto mobile station 202 through a direct and thus reliable and trusted connection to thereby provide secure device communication.

Short-range communications subsystem 240 of FIG. 2 is an additional optional component, which provides for communication between mobile station 202 and different systems or devices, which need not necessarily be similar devices. For example, subsystem 240 may include an infrared device and associated circuits and components, or a Bluetooth™ communication module to provide for communication with similarly enabled systems and devices. Bluetooth™ is a registered trademark of Bluetooth SIG, Inc.

During communications, RF signals are received through antenna 216, amplified and demodulated in receiver 212, so that a digital baseband signal having a symbol period of T may be recovered. The digital baseband signal is sampled by an analog-to-digital converter of receiver 212 which includes a sampler which samples the signal at a sampling period which is determined by a sampling clock signal. Assuming that a phase of the sampling clock signal can be finely adjusted in time so that sampling will occur at the appropriate sampling time instant, user or signaling information may be adequately recovered by sampling the baseband signal at a sampling period of T (i.e. a sampling frequency or rate of 1/T) which may be the same as the symbol or chip period of the baseband signal.

FIG. 3 is a timing diagram which illustrates a plurality of sample points 302 (such as a sample point 304) produced with use of a first sampling clock signal having the sampling period of T. The sampling signal having the sampling period of T is utilized to sample the baseband signal during a normal communication mode when the baseband signal comprises user or signaling information. The sampling period of T may be equal to a symbol or chip period T of the received baseband signal which is currently being sampled. It is indeed viable to sample the baseband signal having the symbol or chip period of T with a sampling signal having the period of T and adequately recover the user or signaling information from the baseband signal as long as the samples are taken at an optimal instant in time (i.e. assuming that the phase of the sampling clock signal can be finely adjusted in time so that sampling will occur at the appropriate sampling time instant).

In FIG. 4, another timing diagram which illustrates a plurality of sample points 402 (such as a sample point 404) produced with use of a second sampling clock signal having a sampling period of T/n (i.e. an oversampling rate of n/T). The second sampling clock signal having the sampling period of T/n may be utilized to sample the baseband signal during a sampling phase determination process of the prior art. The baseband signal which is sampled in the sampling phase determination process comprises a predetermined code which may be synchronization information or preamble information. In the sampling phase determination mode, correlation techniques are utilized to identify an optimal or maximum correlation result associated with a desired phase of the sampling clock signal. Subsequently, the baseband signal is sampled with use of the first sampling clock signal having the sampling period of T at this desired phase in order to adequately recover the user or signaling information from the baseband signal (see FIG. 3).

Note that the value of n for oversampling may be any suitable value such as a fixed value between 4 and 16. Therefore, the oversampling period of the prior art is a fixed value which may be between about T/4 to T/16. In high bandwidth communication systems, high sampling rates require more expensive hardware (e.g. analog-to-digital converter, digital processing unit, and/or buffer memory) and higher power consumption. For Universal Mobile Telephony System (UMTS), the chip rate is 3.84 MHz which corresponds to a sampling rate of 30.72 MHz if the over sampling factor n is equal to 8. For an 802.11-based wireless local area network (WLAN), the chip rate is 11 MHz which corresponds to a sampling rate of 88 MHz if the over sampling factor n is equal to 8. Especially for a low-cost, handheld mobile device utilizing one or more batteries or a battery pack, it is not desirable to have relatively expensive hardware and high power consumption.

FIG. 5 is a flowchart which describes a general method for use in reducing a sampling rate during a sampling phase determination process for the mobile station of FIGS. 1 and 2. Beginning at a start block 502 of FIG. 5, a received baseband signal is sampled at a fixed sampling period of T'=T+m*(T/n) during a sampling phase determination process (step 504 of FIG. 5). The value T is a sampling period utilized for sampling the received signal after the sampling phase determination process is completed. Preferably, T is also the symbol period or chip period of the received signal. The value n is the number of phases of the sampled signal and T/n is a phase resolution period. The value of n may be four (4) or eight (8), for example, or any other suitable value (e.g. between 2 and 20).

The value m is a non-zero integer value where −n<m<n. Preferably, the sampling period of T'=T+m*(T/n) is set just slightly higher or lower than the sampling period T by selecting a suitable value of m. For example, the sampling period of T'=T+m*(T/n) may be set just slightly higher or lower than the sampling period T by a single sampling phase where m=1 or −1. Illustrative examples of sampling periods of T'=T+m*(T/n) are shown and described later below in relation to FIGS. 6 and 7. Note that, during the sampling phase determination process of step 504 of FIG. 5, a high oversampling rate of n/T is not utilized.

The baseband signal which is sampled in the sampling phase determination process may comprise a predetermined code, which may be synchronization information or preamble information. By sampling the received signal at a sampling period of T'=T+m*(T/n), a sample set for each one of n phases of the sampled signal is produced. For each sample set, a correlation process between the sample set at phase i (where i=0, 1, . . . , n) and a predetermined correlation signal at the corresponding time of the samples of the sample set is performed so that a correlation result is produced (step 506 of FIG. 5). Illustrative examples of sample sets are shown and described later below in relation to FIGS. 6 and 7. In the CDMA environment, the predetermined correlation signal is a predetermined pseudorandom noise (PN) signal. From step 506, a plurality of n correlation results associated with the plurality of n sample sets are produced. An optimum or maximum correlation result is then identified from all of the correlation results; this optimum or maximum correlation result is associated with one of the n phases. The received signal is then sampled at a sampling period of T at the phase associated with an optimal correlation result (step 508 of FIG. 5). At this time, the received signal comprises user or signaling information during a normal communication mode which is recovered. The flowchart ends at a finish block 508, but may repeat each time the sampling phase may need to be updated.

Figure 6:
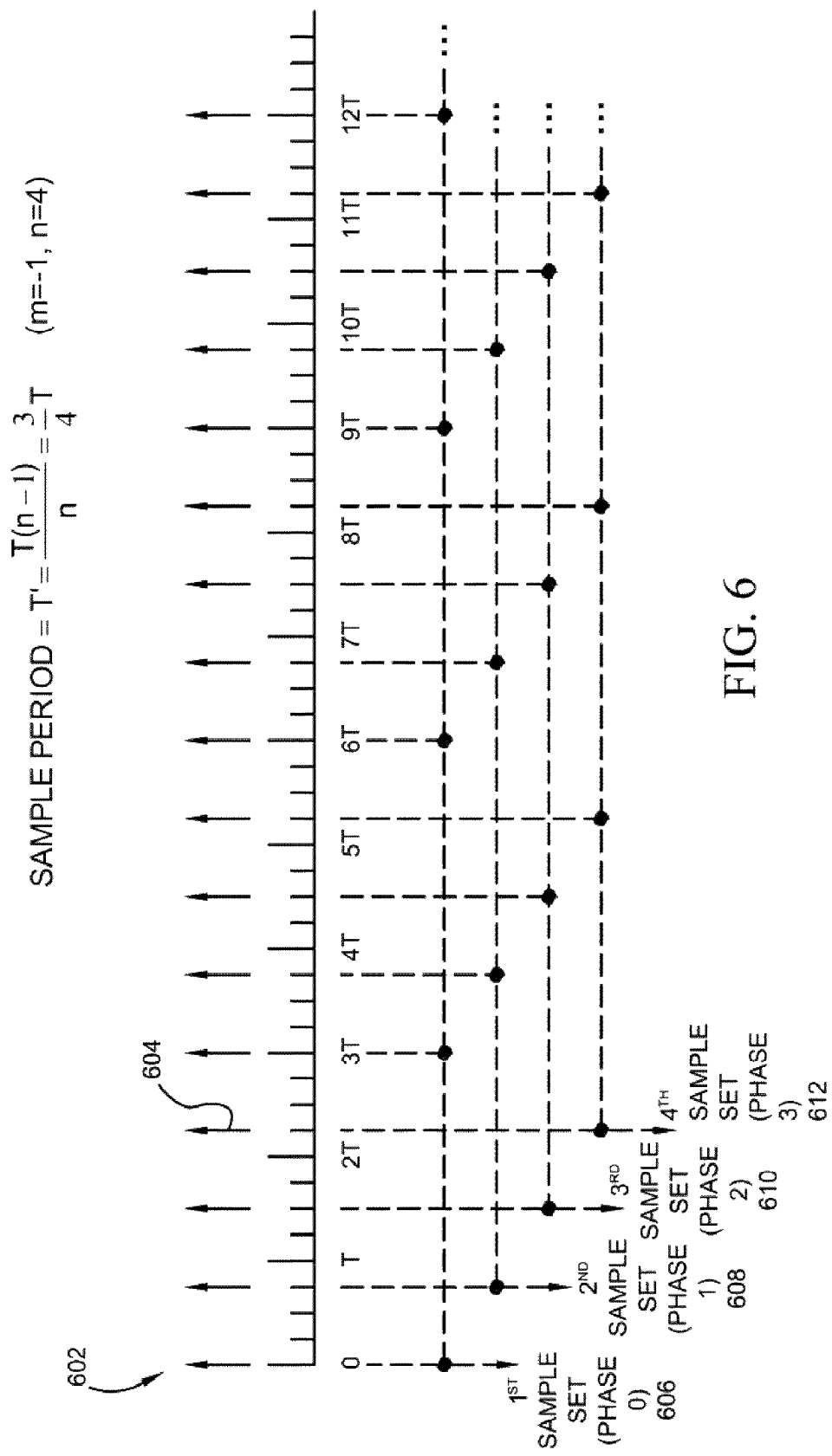
FIG. 6 is a timing diagram which illustrates a plurality of sample points produced at a sampling period of T+m*(T/n) during the sampling phase determination process, where m=−1 and n=4, which produces a sample set for each one of n phases of the sampled signal.

FIG. 6 is a timing diagram which illustrates an example of a plurality of sample points 602 (such as a sampling point 604) produced at a sampling period of T'=T+m*(T/n) during the sampling phase determination process in step 504 of FIG. 5. In this example, n=4 and m=−1 so that the sampling period during the sampling phase determination process is T'=T(n−1)/n=3T/4. As apparent, the sampling period is set just slightly shorter than the sampling period T by a single sampling phase. As shown in FIG. 6, a sample set for each one of n phases (phases 0 through 3) of the sampled signal is produced. The sample sets include a first sample set 606 at phase 0 which is associated with sample points at time 0, time 3T, time 6T, time 9T, etc.; a second sample set 608 at phase 1 which is associated with sample points at time 0+3T/4, time 3T+3T/4, time 6T+3T/4, time 9T+3T/4, etc.; a third sample set 610 at phase 2 which is associated with sample points at time T+2T/4, time 4T+2T/4, time 7T+2T/4, time 10T+2T/4, etc.; and a fourth sample set 612 at phase 3 which is associated with sample points at time 2T+T/4, 5T+T/4, 8T+T/4, 11T+T/4, etc. Each one of these sample sets is utilized in a correlation process in step 506 of FIG. 5.

Figure 7:
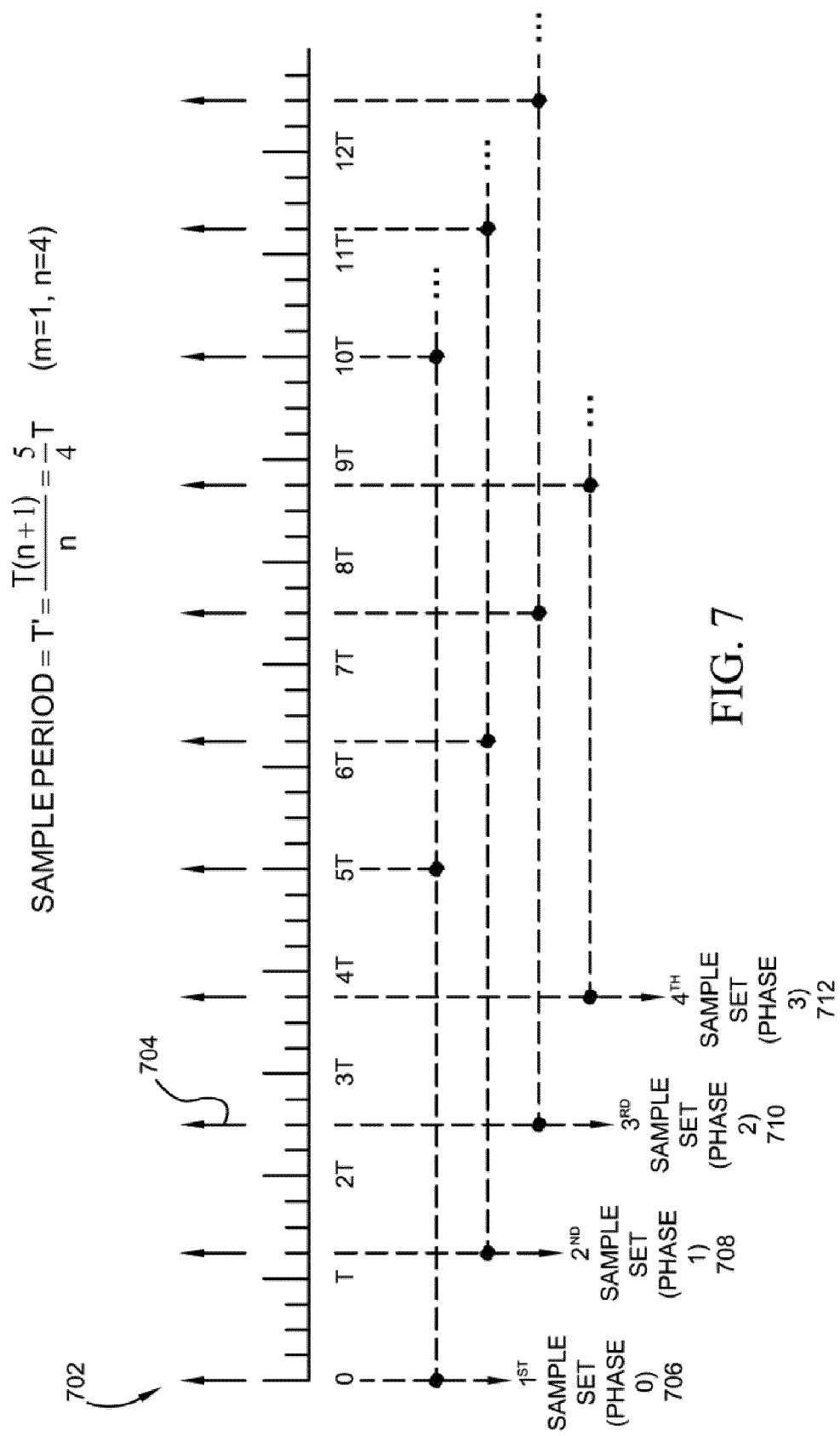
FIG. 7 is another timing diagram which illustrates a plurality of sample points produced at a sampling period of T+m*(T/n) during the sampling phase determination process, where m=+1 and n=4, which also produces a sample set for each one of n phases of the sampled signal.

FIG. 7 is a timing diagram which illustrates another example of a plurality of sample points (such as a sampling point 704) produced at a sampling period of T'=T+m*(T/n) during the sampling phase determination process in step 504 of FIG. 5. In this example, n=4 and m=+1 so that the sampling period during the sampling phase determination process is T'=T(n+1)/n=5T/4. As apparent, this sampling period is set just slightly longer than the sampling period T by a single sampling phase. As shown in FIG. 7, a sample set for each one of n phases (phases 0 through 3) of the sampled signal is produced. The sample sets include a first sample set 706 at phase 0 which is associated with sample points at time 0, time 5T, time 10T, etc.; a second sample set 708 at phase 1 which is associated with sample points at time T+T/4, time 6T+T/4, time 11T+T/4; etc.; a third sample set 710 at phase 2 which is associated with sample points at time 2T+2T/4, time 7T+2T/4, time 12T+2T/4, etc.; and a fourth sample set 712 at phase 3 which is associated with sample points at time 3T+3T/4, 8T+3T/4, etc. Each one of these sample sets is utilized in a correlation process in step 506 of FIG. 5.

Figure 8:
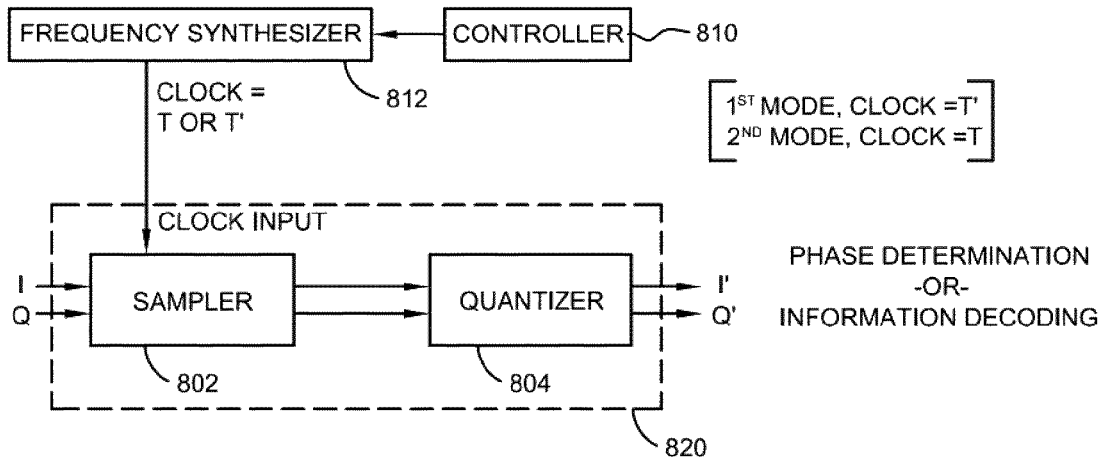
FIG. 8 shows a first embodiment of circuitry which may be utilized to implement the techniques of the present application.

FIG. 8 shows a first embodiment of circuitry which may be utilized to implement the techniques of the present application, as described in relation to FIGS. 5-7 above. The circuitry of FIG. 8 includes control circuitry or controller 810 (e.g. controller 106 of FIG. 1 or microprocessor 238 of FIG. 2), a frequency synthesizer 812 with phase control, and an analog-to-digital converter 820. Analog-to-digital converter 820 includes a sampler 802 and a quantizer 804. I and Q analog baseband signals are received at inputs to sampler 802, which samples the signals to produce sampled I and Q baseband signals at its outputs. The sampled I and Q baseband signals are fed into inputs to quantizer 804, which quantizes the signals to produce digital I' and Q' baseband signals at its outputs. Sampler 802 has a clock input which is coupled to a clock output from frequency synthesizer 812. Frequency synthesizer 812 is adapted to produce, at its clock output, a sampling clock signal having one of a plurality of different frequencies as controlled by controller 810. Since frequency synthesizer 812 has phase control, it has additional functionality to select a phase of the sampling clock signal as well.

Frequency synthesizer 812 is set or programmed by controller 810 to produce the sampling clock signal at its clock output. Specifically, controller 810 of FIG. 8 is adapted or programmed to set frequency synthesizer 812 to produce a sampling clock signal having a period of T'=T+m*(T/n) during a sampling phase determination mode (e.g. for step 504 of FIG. 5 and FIG. 6 or 7). During the sampling phase determination mode, the received signal may comprise a predetermined code. During a normal communication mode (e.g. for step 508 of FIG. 5), controller 810 is adapted or programmed to set frequency synthesizer 812 to produce a sampling clock signal having a period of T and a phase that is determined from the sampling phase determination mode. During the normal communication mode, the received signal comprises user or signaling information.

With use of the circuit of FIG. 8, the sampling phase determination mode occurs during a first time period and the normal communication mode occurs during a second time period which follows the first time period. The sampling phase determination mode may be performed again each time the predetermined code is transmitted and/or when the sampling phase may need updating.

Figure 9:
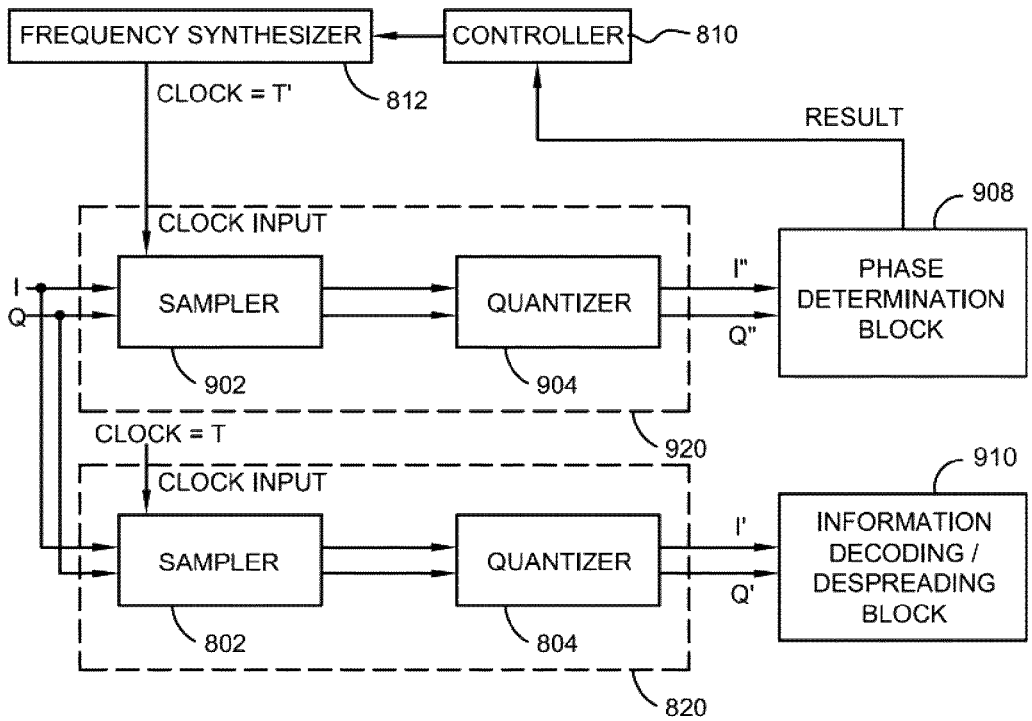
FIG. 9 is a second embodiment of circuitry which may be utilized to implement the techniques of the present application.

FIG. 9 is a second embodiment of circuitry which may be utilized to implement the techniques of the present application, as described in relation to FIGS. 5-8. The circuitry of FIG. 9 includes control circuitry or controller 810 (e.g. controller 106 of FIG. 1 or microprocessor 238 of FIG. 2), frequency synthesizer 812 having phase control, two analog-to-digital converters 820 and 920, an optimal phase determination block 908, and an information/signaling decoding block or decoder 910. Analog-to-digital converter 820 was described above in relation to FIG. 8 and operates in substantially the same way, except that it operates only on a received signal comprising the user or signaling information. I' and Q' outputs from quantizer 804 are coupled to information/signaling decoding block 910 to process information or signaling in a conventional fashion (e.g. despreading and decoding the information).

On the other hand, analog-to-digital converter 920 operates exclusively for the sampling phase determination process. Analog-to-digital converter 920 is similar to analog-to-digital converter 820 and includes a sampler 902 and a quantizer 904. The I and Q analog baseband signals are received at inputs to sampler 902, which samples the signals to produce sampled I and Q baseband signals at its outputs. Sampler 902 has a clock input which is coupled to a clock output from frequency synthesizer 812. The sampled I and Q baseband signals are fed into inputs to quantizer 904, which quantizes the signals to produce digital I" and Q" baseband signals at its outputs. The I" and Q' outputs from quantizer 904 are coupled to inputs to phase determination block 908, which operates to identify the optimal phase result of the signal. An output from phase determination block 908 is coupled to an input to controller 810 for providing the optimal phase result to controller 810.

Frequency synthesizer 812 is set or programmed by controller 810 to produce sampling clock signals for both sampler 802 and sampler 902. In particular, controller 810 of FIG. 9 is adapted or programmed to set frequency synthesizer 812 to produce a first sampling clock signal having a period of T'=T+m*(T/n) for sampler 902 (e.g. for step 504 of FIG. 5, and FIG. 6 or 7). This is done for the sampling phase determination process. Phase determination block 908 identifies the optimal phase result from the I" and Q" signals from quantizer 904 and provides this result to controller 810. Controller 810 is also adapted or programmed to set frequency synthesizer 812 to produce a second sampling clock signal having a period of T for sampler 802 (e.g. for step 508 of FIG. 5). Here, controller 810 uses the optimal phase result from phase determination block 908 to set the appropriate optimal phase of the second sampling clock signal. This is done for information/signaling decoding.

Thus, with use of the circuit of FIG. 9, the sampling phase determination mode is performed with use of a first analog-to-digital converter and the normal communication mode is performed with use of a second analog-to-digital converter. The first and second clock signals may be simultaneously generated, or analog-to-digital converters 802 and 902 may operate over the same time periods.

Figure 10:
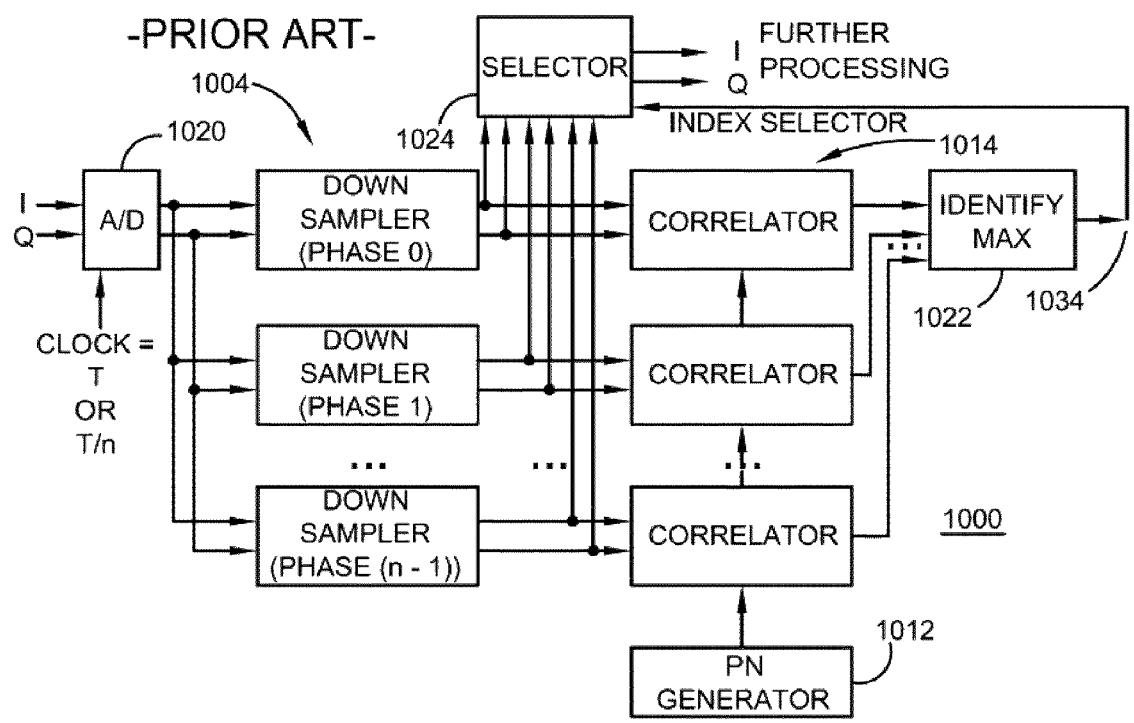
FIG. 10 is a schematic block diagram of electronic circuit used for sampling a received signal according to conventional techniques.

FIG. 10 is a schematic block diagram of a conventional electronic circuit 1000 used as part of a correlator searcher. The electronic circuit 1000 includes an analog-to-digital converter 1020, a plurality of n downsamplers 1004, a plurality of n correlators 1014, a pseudorandom noise (PN) code generator 1012, an optimal level detector 1022, and a selector 1024 (e.g. a multiplexer). I and Q baseband signals are received at inputs to analog-to-digital converter 1020. Outputs from analog-to-digital converter 1020 are coupled to and provide digitized I and Q baseband signals to each input of downsamplers 1004. Outputs from each downsampler 1004 are coupled to and provide only a selected phase of the digitized I and Q baseband signals to a corresponding correlator 1014. The outputs from each downsampler 1004 are also coupled to inputs to selector 1024. An output from PN generator 1012 is coupled to and produces a PN code at each input of correlators 1014, which have outputs coupled to optimal level detector 1022. An output 1034 from optimal level detector 1022 is coupled to an input to selector 1024 for providing a selection signal to selector 1024. The selection signal is used at selector 1024 for selecting and providing one set of inputs from a downsamplers 1004 to an output from selector 1024 for additional processing.

A sampling phase determination process using electronic circuit 1000 typically involves oversampling the baseband signal by n samples per modulation symbol or chip using analog-to-digital converter 1020. The value of n may be 4 or 8, for example, so that the baseband signal may be oversampled by as much as 4 or 8 times (e.g. sample period=T/n=T/4 or T/8). Using downsampler 1004, PN code generator 1012, and correlators 1014, a correlation process between each baseband signal at one of the n phases respectively and a PN code is performed. An optimal or maximum correlation result associated with the appropriate phase is identified with use of optimal level detector 1022. Subsequently, the baseband signal is sampled at the sampling period of T with analog-to-digital converter 1020 at the appropriate phase identified from the sampling phase determination process to recover the user or signaling information. Alternatively, selector 1024 is not needed where sampling at both T/n and T is continuously and simultaneously performed on the received signal.

Figure 11:
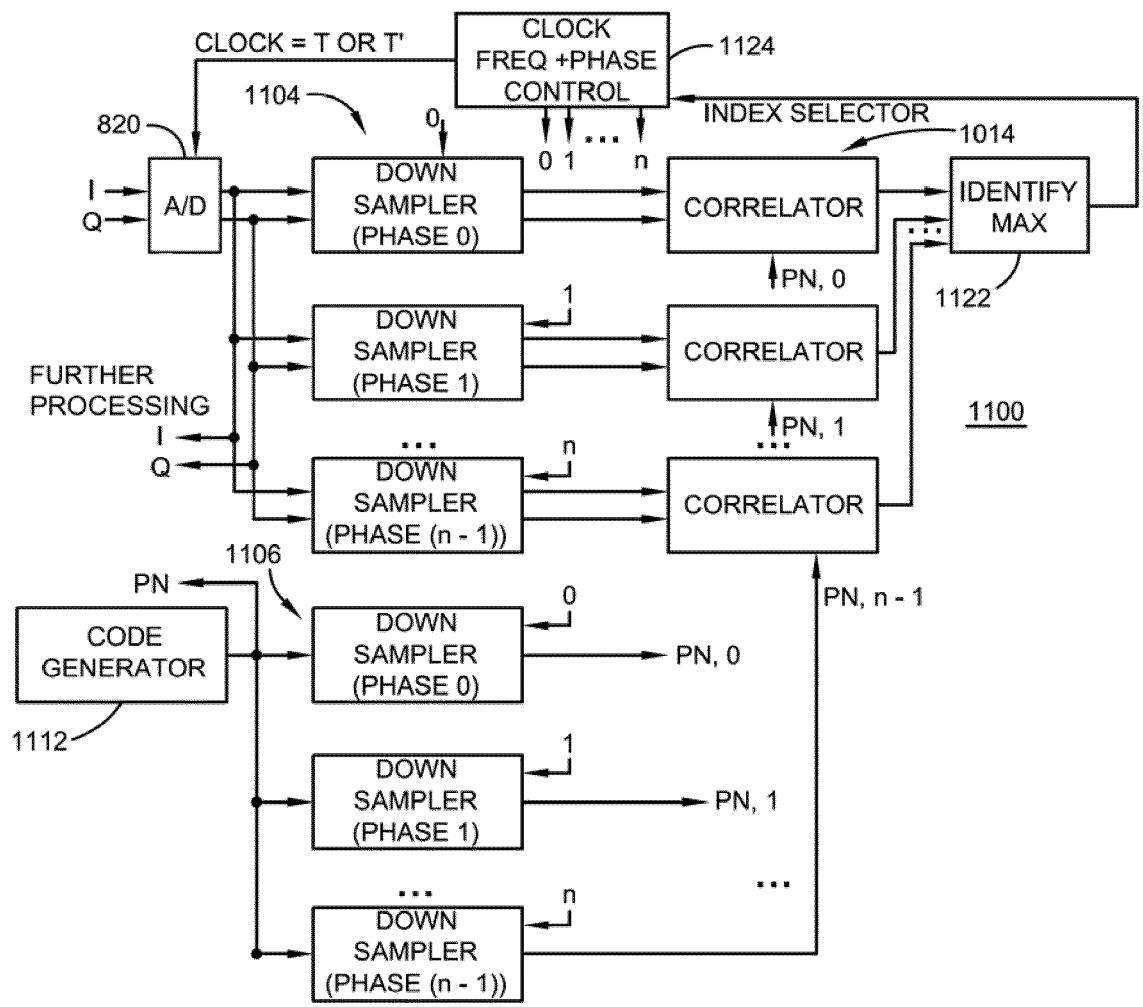
FIG. 11 is a schematic block diagram of an electronic circuit which may be utilized to implement the techniques of the present application.

FIG. 11 is a schematic block diagram of an electronic circuit 1100 used as part of a correlator searcher in accordance with techniques of the present application, as described above in relation to FIGS. 5-8. The electronic circuit 1100 includes analog-to-digital converter 820 (e.g. see FIG. 8), a plurality of n downsamplers 1104 for the received baseband signal (one for each phase 0 through n−1), a plurality of n downsamplers 1106 for a predetermined code signal (one for each phase 0 through n−1), a predetermined code generator 1112 (e.g. a PN code generator), a plurality of n correlators 1114, an optimal level detector 1122, and a clock frequency and phase controller 1124. I and Q baseband signals are received at inputs to analog-to-digital converter 820. Outputs from analog-to-digital converter 820 are coupled and provide digitized I and Q baseband signals to each input of downsamplers 1104. Outputs from each downsamplers 1104 are coupled to and provide only a selected phase of the digitized I and Q baseband signals to a corresponding correlator 1114. An output from predetermined code generator 1112 is coupled to and produces a predetermined correlation signal at each input of correlators 1114, which have outputs coupled to optimal level detector 1122. An output from optimal level detector has an output coupled to an input to clock frequency and phase controller 1124 for providing a selection signal.

A sampling phase determination process using electronic circuit 1100 involves sampling the baseband signal at a sampling period of T'=T+m*(T/n) using analog-to-digital converter 820 which is under control by clock frequency and phase controller 1124, as described above in relation to FIGS. 5-9. Here, a sample set for each one of n phases of the sampled signal is received at a corresponding one of the downsamplers 1104. Using downsamplers 1104 and 1106, predetermined code generator 1112, and correlators 1114, a correlation process between each baseband signal at one of the n phases and a predetermined code at the corresponding phase is performed. The down sampling factor for each downsampler 1104 is n, whereas the down sampling factor for each downsampler 1106 is n'=n+m. An optimal or maximum correlation result associated with the appropriate phase is then identified with use of optimal level detector 1122. Subsequently, the baseband signal is sampled at the sampling period of T with analog-to-digital converter 820 at the appropriate phase identified from the sampling phase determination process to recover the user or signaling information.

A delay locked loop (DLL) may be utilized in lieu of the CDMA searcher for fine delay determination, where three correlators (i.e. an early correlator, an on-time correlator, and a late correlator) correlate the PN code with samples of three I-Q signals. A CDMA search may still be needed for a coarse delay determination. In general, feedback is utilized to adjust the delay of the samples until the early and late correlators produce the same output level and the on-time correlator produces the highest output level.

Suppose the transmission mode of a given CDMA system is continuous and may last for a relatively long time. Alternatively, suppose that although transmission is in burst mode, between bursts the time and frequency relation are synchronized to the same stable source at the transmitter and the propagation path delays are relatively slow-varying relative to the time span between bursts. Given these conditions, a DLL-based solution to track optimal timing is preferred. In such system, the DLL typically needs to be initialized to a predetermined approximate optimal sampling time but subsequently it handles tracking the changes in the optimal sampling instant. The task to select and assign an initial approximate optimal sampling point to the DLL is accomplished by the searcher-based solution described earlier. Subsequent to the initial selection, an alternative technique is utilized which is now described.

For the DLL technique, electronic circuit 1100 of FIG. 11 may be utilized where three (3) downsamplers 1104 are utilized for early, mid, and late phases and three (3) downsamplers 1106 are utilized for the same three phases. Optimal level detector 1122 of FIG. 11 is instead a delay adjustor 1122.

Suppose there are either pilot symbols embedded in the data stream periodically or there are preambles in at least some bursts in a regular or periodic fashion. The pilot symbols or the preambles do not overlap with the intended information stream in time and may be used for DLL tracking purpose. During the pilot symbol or preamble, the receiver is in a DLL mode and DLL components are enabled. Outside the pilot symbol or preamble periods, the receiver is in a normal communication mode where the DLL components are disabled; however the previous timing phase result is stored and used again when the DLL mode is re-enabled.

In the DLL mode, clock frequency and phase controller 1124 generates a sampling clock signal having a sampling period of T' and the sampled I-Q stream are downsampled by a factor n at 3 different phases: the early phase, the mid (or on-time) phase, and the late phase. A PN code is generated by predetermined code generator 1112 and downsampled by n'=n+m. The downsampled I-Q and downsampled PN are correlated by the early, mid, and late correlators 1114. Delay adjustor 1122 makes the decision of delay adjustment based on the three correlator output values. This is the same as in a conventional DLL. An output from delay adjustor 1122 controls the phase of the early, mid, and late downsamplers to move forward or backward by the same amount. When the effective sampling point moves across a PN symbol boundary, the downsampler for the PN also needs to adjust and the above process is repeated. This way, the mid (on-time) phase always tracks the optimal sampling point. In the normal communication mode, clock frequency and phase controller 1124 generates the sampling signal at a sampling period of T at the updated optimal phase that the DLL mode identified for the mid (on-time) phase. The sampled I-Q and the PN are ready to be passed to further processing.

In other embodiments, for TDMA and other non-CDMA communications, for example, a timing estimation loop is typically utilized to adjust the sampling time in accordance with a criterion that maximizes the "eye-diagram opening." The techniques of the present application may be utilized in these TDMA and other non-CDMA communication in the same or similar fashion.

Final Comments. Methods and apparatus for use in reducing a sampling rate during a sampling phase determination process have been described. In one illustrative example, a received signal is sampled at a sampling period of T+m*(T/n) during a sampling phase determination process. T may be a symbol or chip period of the received signal, n is a number of phases of the sampled signal, T/n is a phase resolution period, and m is a fixed non-zero integer value where −n<m<n (e.g. m=1 or −1). By sampling the received signal at the sampling period of T+m*(T/n), a sample set for each one of n phases of the sampled signal is produced. For each sample set, a correlation process is performed between the sample set and a predetermined correlation signal to produce a correlation result. Once an optimal correlation result is identified from the correlation process, the received signal is sampled at a sampling period of T at a phase associated with the optimal correlation result. Advantageously, oversampling at a sampling period of T/n is not required during the sampling phase determination process, which reduces cost and power consumption.

An electronic circuit of the present application comprises control circuitry, an analog-to-digital converter which includes a sampler, and a plurality of n correlators. The control circuitry is adapted to cause the sampler to sample a received signal at a sampling period of T+m*(T/n) during a sampling phase determination process, where n is the number of phases of the sampled signal, T/n is a phase resolution period, and m is a non-zero integer value where −n<m<n (e.g. m=1 or −1). During the sampling phase determination process, an output from the sampler provides a sample set for each one of n phases of the sampled signal. Each correlator of the plurality of n correlators has a first input adapted to receive one of the sample sets associated with a corresponding one of the n phases of the sampled signal, a second input adapted to receive a predetermined correlation signal, and an output which provides a correlation result from a correlation process between the sample set and the predetermined correlation signal. The control circuitry is further adapted to cause the sampler to sample the received signal at a sampling period of T at one of the n phases associated with an optimal correlation result.

A communication device of the present application includes a wireless receiver, a frequency synthesizer of the wireless receiver, control circuitry coupled to the frequency synthesizer; and an analog-to-digital converter. The analog-to-digital converter has a sampler, an input for receiving a signal through the wireless receiver, a clock input coupled to a clock output of the frequency synthesizer, and an output. The control circuitry is adapted to set the frequency synthesizer to produce a clock signal at the clock output so that the sampler samples the received signal at a sampling period of T+m*(T/n) during a sampling phase determination process, where n is the number of phases of the sampled signal, T/n is a phase resolution period, and m is a non-zero integer value where −n<m<n (e.g. m=1 or −1). During the sampling phase determination process, the output from the analog-to-digital converter provides a sample set for each one of n phases of the sampled signal. Each correlator of the plurality of n correlators has a first input adapted to receive one of the sample sets associated with a corresponding one of the n phases of the sampled signal, a second input adapted to receive a predetermined correlation signal, and an output which provides a correlation result from a correlation process between the sample set and the predetermined correlation signal. The control circuitry is further adapted to set the frequency synthesizer to produce a clock signal at the clock output so that the sampler samples the received signal at a sampling period of T at one of the n phases associated with an optimal correlation result, in an operation mode other than the sampling phase determination process.

The above-described embodiments of the present application are intended to be examples only. Those of skill in the art may effect alterations, modifications and variations to the particular embodiments without departing from the scope of the application. The invention described herein in the recited claims intends to cover and embrace all suitable changes in technology.

What is claimed is:

1. A method for use in a receiver, the method comprising:
in a sampling phase determination process for the receiver:
sampling, in the receiver, a signal at a sampling period of T±T/n for producing a sample set for each one of n phases of the sampled signal, where T is a symbol or chip period of the signal and n is a number of phases of the sampled signal where n≧4; and
for each sample set, performing a correlation process between the sample set and a pseudorandom noise (PN) sequence for thereby producing a correlation result;
identifying, from the correlation results, one of the phases associated with an optimal correlation result; and
in a communication mode of the receiver:
sampling, in the receiver, a received signal at a sampling period of T at the phase associated with the optimal correlation result, for use in recovering user or signaling information from the received signal.

2. The method of claim 1, wherein the receiver comprises a direct sequence spread spectrum (DSSS) receiver and the received signal comprises a DSSS signal.

3. The method of claim 1, further comprising:
wherein the act of sampling the signal at the sampling period of T±T/n comprises sampling the received signal during a first time period; and
wherein the act of sampling the received signal at the sampling period of T comprises sampling during a second time period following the first time period.

4. The method of claim 1, further comprising:
wherein the act of sampling the signal at the sampling period of T±T/n comprises sampling with a first analog-to-digital converter; and
wherein the act of sampling the received signal at the sampling period of T comprises sampling with use of a second analog-to-digital converter.

5. The method of claim 1, further comprising:
performing a first downsampling process to produce the sample set for each one of the n phases of the sampled signal; and
performing a second downsampling process to produce the PN sequence for each correlation process associated with the sample sets.

6. The method of claim 1, wherein n=4, 8, or 16.

7. An electronic circuit comprising:
control circuitry;
an analog-to-digital converter which includes a sampler;
the control circuitry being configured to control the sampler, in a sampling phase determination process, to sample a signal at a sampling period of T±T/n, where T is a symbol or chip period of the signal and n is the number of phases of the sampled signal where n≧4, for outputting a sample set for each one of n phases of the sampled signal;
a pseudorandom noise (PN) generator configured to produce a PN signal;
a plurality of n correlators, each correlator having:
a first input configured to receive one of the sample sets associated with a corresponding one of the n phases of the sampled signal;
a second input configured to receive the PN signal;
an output which provides a correlation result from a correlation process between the sample set and the PN signal; and
the control circuitry being further configured to identify, from the correlation results, one of the phases associated with an optimal correlation result; and
the control circuitry being further configured to control the sampler, in a communication mode, to sample a received signal at a sampling period of T at the phase associated with the optimal correlation result, for use in recovering user or signaling information from the received signal.

8. The electronic circuit of claim 7, wherein the received signal comprises a direct sequence spread spectrum (DSSS) signal.

9. The electronic circuit of claim 7, wherein the control circuitry is further configured to cause the sampler to sample the signal at the sampling period of T±T/n during a first time period and sample the received signal at the sampling period of T during a second time period following the first time period.

10. The electronic circuit of claim 7, wherein n=4, 8, or 16.

11. The electronic circuit of claim 7, further comprising:
a first plurality of n downsamplers coupled to the output from the sampler to produce the sample set for each one of the n phases of the sampled signal; and
a second plurality of n downsamplers to produce the PN signal for each one of the plurality of n correlators.

12. The electronic circuit of claim 7, wherein the sampler is a first sampler and the electronic circuit further comprises:
   a second sampler; and
   the control circuitry being configured to control the second sampler, in the communication mode, to sample the received signal at the sampling period of T at the phase associated with the optimal correlation result, for use in recovering the user or signaling information from the received signal.

13. A communication device, comprising:
   a wireless receiver;
   a frequency synthesizer of the wireless receiver;
   control circuitry coupled to the frequency synthesizer;
   an analog-to-digital converter which includes:
      a sampler;
      a clock input coupled to a clock output of the frequency synthesizer;
   the control circuitry being configured to set the frequency synthesizer, in a sampling phase determination process, to produce a clock signal at the clock output so that the sampler samples a signal at a sampling period of $T\pm T/n$, where T is a symbol or chip period of the signal and n is the number of phases of the sampled signal where $n\geq 4$, for outputting a sample set for each one of n phases of the sampled signal;
   a pseudorandom noise (PN) generator configured to produce a PN signal;
   a plurality of n correlators, each correlator having:
      a first input configured to receive one of the sample sets associated with a corresponding one of the n phases of the sampled signal;
      a second input configured to receive the PN signal;
      an output which provides a correlation result from a correlation process between the sample set and the PN signal;
   the control circuitry being further configured to identify, from the correlation results, one of the phases associated with the an optimal correlation result; and
   the control circuitry being further configured to set the frequency synthesizer, in a communication mode, to produce a clock signal at the clock output so that the sampler samples a received signal at a sampling period of T at the phase associated with the optimal correlation result, for use in recovering user or signaling information from the received signal.

14. The communication device of claim 13, wherein the received signal comprises a direct sequence spread spectrum (DSSS) signal.

15. The communication device of claim 13, wherein n=4, 8, or 16.

16. The communication device of claim 13, wherein the sampler is set to sample the signal at the sampling period of $T\pm T/n$ during a first time period and set to sample the received signal at the sampling period of T during a second time period following the first time period.

17. The communication device of claim 13, further comprising:
   a first plurality of n downsamplers coupled to the output from the analog-to-digital converter to produce the sample set for each one of the n phases of the sampled signal; and
   a second plurality of n downsamplers to produce the PN signal for each one of the plurality of n correlators.

18. The communication device of claim 13, wherein the wireless receiver is configured for communications in a wireless communication network and the received signal is a signal from the wireless communication network.

19. The communication device of claim 13, comprising a mobile station.

20. The communication device of claim 13, wherein the sampler is a first sampler and the communication device further comprises:
   a second sampler; and
   the control circuitry being configured to control the second sampler, in the communication mode, to sample the received signal at the sampling period of T at the phase associated with the optimal correlation result, for use in recovering the user or signaling information from the received signal.

* * * * *